(12) United States Patent
Mallikararjunaswamy

(10) Patent No.: US 9,647,078 B2
(45) Date of Patent: May 9, 2017

(54) CLOSED CELL CONFIGURATION TO INCREASE CHANNEL DENSITY FOR SUB-MICRON PLANAR SEMICONDUCTOR POWER DEVICE

(71) Applicant: Alpha and Omega Semiconductor Incorporated, Sunnyvale, CA (US)

(72) Inventor: Shekar Mallikararjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/839,366

(22) Filed: Aug. 28, 2015

(65) Prior Publication Data

US 2016/0268385 A1    Sep. 15, 2016

Related U.S. Application Data

(60) Continuation of application No. 13/134,407, filed on Jun. 6, 2011, now Pat. No. 9,147,674, which is a division of application No. 11/473,938, filed on Jun. 23, 2006, now Pat. No. 7,956,384.

(51) Int. Cl.
| | |
|---|---|
| *H01L 23/52* | (2006.01) |
| *H01L 29/417* | (2006.01) |
| *H01L 27/02* | (2006.01) |
| *H01L 29/423* | (2006.01) |
| *H01L 29/06* | (2006.01) |
| *H01L 29/78* | (2006.01) |
| *H01L 23/528* | (2006.01) |
| *H01L 23/535* | (2006.01) |
| *H01L 27/088* | (2006.01) |

(52) U.S. Cl.
CPC .... *H01L 29/41758* (2013.01); *H01L 27/0207* (2013.01); *H01L 29/0696* (2013.01); *H01L 29/4238* (2013.01); *H01L 29/7816* (2013.01); *H01L 23/52* (2013.01); *H01L 23/528* (2013.01); *H01L 23/535* (2013.01); *H01L 27/088* (2013.01); *H01L 2924/0002* (2013.01)

(58) Field of Classification Search
CPC . H01L 121/8234; H01L 23/52; H01L 23/528; H01L 23/535; H01L 27/0207; H01L 29/4238; H01L 27/088
USPC ................................ 257/342, 207, 365, 366
See application file for complete search history.

(56) References Cited

U.S. PATENT DOCUMENTS

2007/0138549 A1*  6/2007  Wu ..................... H01L 29/4238
                                                    257/341

* cited by examiner

*Primary Examiner* — Julio J Maldonado
*Assistant Examiner* — Hajar Kolahdouzan
(74) *Attorney, Agent, or Firm* — Bo-In Lin

(57) ABSTRACT

A semiconductor power device supported on a semiconductor substrate that includes a plurality of transistor cells, each cell has a source and a drain region disposed on opposite sides of a gate region in the semiconductor substrate. A gate electrode is formed as an electrode layer on top of the gate region for controlling an electric current transmitted between the source and the drain regions. The gate electrode layer disposed on top of the semiconductor substrate is patterned into a wave-like shaped stripes for substantially increasing an electric current conduction area between the source and drain regions across the gate.

10 Claims, 9 Drawing Sheets

CLOSED CELL CONFIGURATION TO INCREASE CHANNEL DENSITY FOR SUB-MICRON PLANAR SEMICONDUCTOR POWER DEVICE

This is a Continuation Application of a previously filed co-pending application Ser. No. 13/134,407 filed on Jun. 6, 2011 by an identical common inventor of this Application. Application Ser. No. 13/134,407 is a Divisional Application of a previously filed co-pending application Ser. No. 11/473,938 filed on Jun. 23, 2006 by an identical common inventor of this Application and now issued into U.S. Pat. No. 7,956,384 on Jun. 7, 2011. The disclosures made in application Ser. Nos. 13/134,407 and 11/473,938 are hereby incorporated by reference in this Patent Application.

BACKGROUND OF THE INVENTION

1. Field of the Invention

The invention relates generally to the planar semiconductor power devices. More particularly, this invention relates to an improved and novel closed cell configuration with increased channel density, i.e., the channel width per unit of semiconductor area, for sub-micron planar semiconductor power device.

2. Description of the Prior Art

Conventional technologies have reached a limit to reduce the on-resistance of lateral MOS transistors by increasing the channel width in a given MOS transistor area. Reduction of the on-resistance for a cellular array of MOS transistors is desirable because of the lower power loss and ability to conduct high currents. In low voltage application, e.g., MOSFETS application for a voltage lower than 12 volts, lateral MOSFETs offer lower device resistance than vertical double-diffused metal oxide field effect transistors (VDMOS). However, in design large area lateral MOSFETs, the contribution due to parasitic resistance such as Metal bussing increases. It is well know in the art that a VDMOS can achieve low on resistance when measured in term of a unit area of cellular cells. Such low on-resistance is achieved with whole surface area functioning as a drain electrode. Such configuration allows high density of vertically parallel transistors to connect in parallel. These parallel vertical current channels are formed between a source region, covering a large area of a top surface, and the drain electrode connected to a bottom surface. However, there are applications where the VDMOS transistors cannot be conveniently integrated. Under these circumstances, a lateral MOS transistor is generally used despise the fact that a vertical MOS transistor can achieve a lower on-resistance than the lateral MOS transistors.

In order to overcome this drawback of higher on-resistance, a first and most straightforward way to reduce the on-resistance contribution from metal and contact for a lateral MOS resistance is to increase the width of the contacts and metal stripes However, a greater width of the contact metal stripes increases the areas occupied by the transistor array. The reduction of the on-resistance is obtained at the expense of increasing the areas occupied by the transistor array. For this reason, with a strong demand to miniaturize the electronic devices, this method does not provide an effective solution to reduce the on-resistance of the lateral MOSFET devices.

Various layouts of the cell arrays are explored to achieve the purpose of increasing the channel width per unit area (W/area). FIG. 1A shows an alternate configuration with a stripe cell configuration to obtain large channel width by connecting several MOSFETs in parallel. In these stripe cell arrays, alternating drain and source stripes are placed next to each other so that each drain/source stripe shares with adjacent source/drain thereby reducing the overall area of the device. The increased channel width provided by the stripe cell is able to enhance the power management efficiency in circuits such as switching regulator, low dropout regulators and discrete MOSFET drivers.

FIG. 1B is shows a cellular transistor array implemented with a polysilicon gate mesh. The polysilicon gate mesh formed as square cell. As shown in FIG. 1B, the square cell array further increases the channel width per unit area (W/area) by drawing a mesh of polysilicon lines to form alternating source and drain cells that are connected in parallel by metal. More particularly, in U.S. Pat. No. 5,355,008, a square mesh array is implemented in a MOSFET device. By forming the openings in the polysilicon mesh to be in a diamond shape, i.e., having a long diagonal and a short diagonal), the source and drain metal strips, arranged in the direction of the short diagonals, can be made wider and shorter, thus reducing the on-resistance of the transistor without increasing the area of the transistor.

However, as there are strong demands to provide the semiconductor power devices for larger current switching operations with low on-resistance, there still exists a need to further increase the channel density (W/area). Therefore, it is necessary to provide alternate layout for the lateral transistor cell arrays to further increased the channel width per unit area (W/area). It is also desirable that the on-resistance can be further reduced without sacrificing the transistor areas. Furthermore, it is desirable that the lateral transistor arrays can be manufactured with standard CMOS technologies such that the above discussed difficulties and limitations can be resolved.

SUMMARY OF THE PRESENT INVENTION

It is therefore an aspect of the present invention to provide a new and improved lateral semiconductor power device implemented with novel layout to increase the channel width per unit area. The on-resistance can be further increased with this novel layout of cell array suitable for large current switching operations such that the above discussed problems and difficulties can be resolved.

Specifically, it is an aspect of the present invention to provide improved lateral semiconductor power device implemented with a new layout of transistor cells in a transistor cell array. In this new transistor cell array, the gate regions formed generally with polysilicon disposed between the source and drain regions are configured to have a wave-like configuration. The polysilicon gate regions are formed to comply with the minimum spacing rule allowed by the technology. Since the polysilicon gate regions are drawn to a minimum spacing with the source and drain contacts between the polysilicon gates formed with a wave-like pattern, a higher channel density is achieved. A higher channel density translated into a higher channel width per unit area (W/area).

Briefly in a preferred embodiment this invention discloses a lateral semiconductor power device supported on a semiconductor substrate. The lateral semiconductor power device includes a plurality of transistor cells each includes a source and a drain region disposed on opposite sides of a gate region in the semiconductor substrate wherein a gate electrode is formed as an electrode layer on top of the gate region for controlling an electric current transmitted between the source and the drain regions. The gate electrode layer disposed on top the semiconductor layer is patterned into a wave-shape configuration for substantially increasing an electric current conduction area between the source and drain regions across the gate.

This invention further discloses a method for configuring a semiconductor power device supported on a semiconductor substrate. The method includes a step of forming a plurality of transistor cells each with a source and a drain region disposed on opposite sides of a gate region in the semiconductor substrate. The method further includes a step of forming a gate electrode layer on top of the gate region on top of the gate region for controlling an electric current transmitted between the source and the drain regions and patterning the gate electrode layer into a wave-shaped stripes for substantially increasing an electric current conduction area between the source and drain regions across the gate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
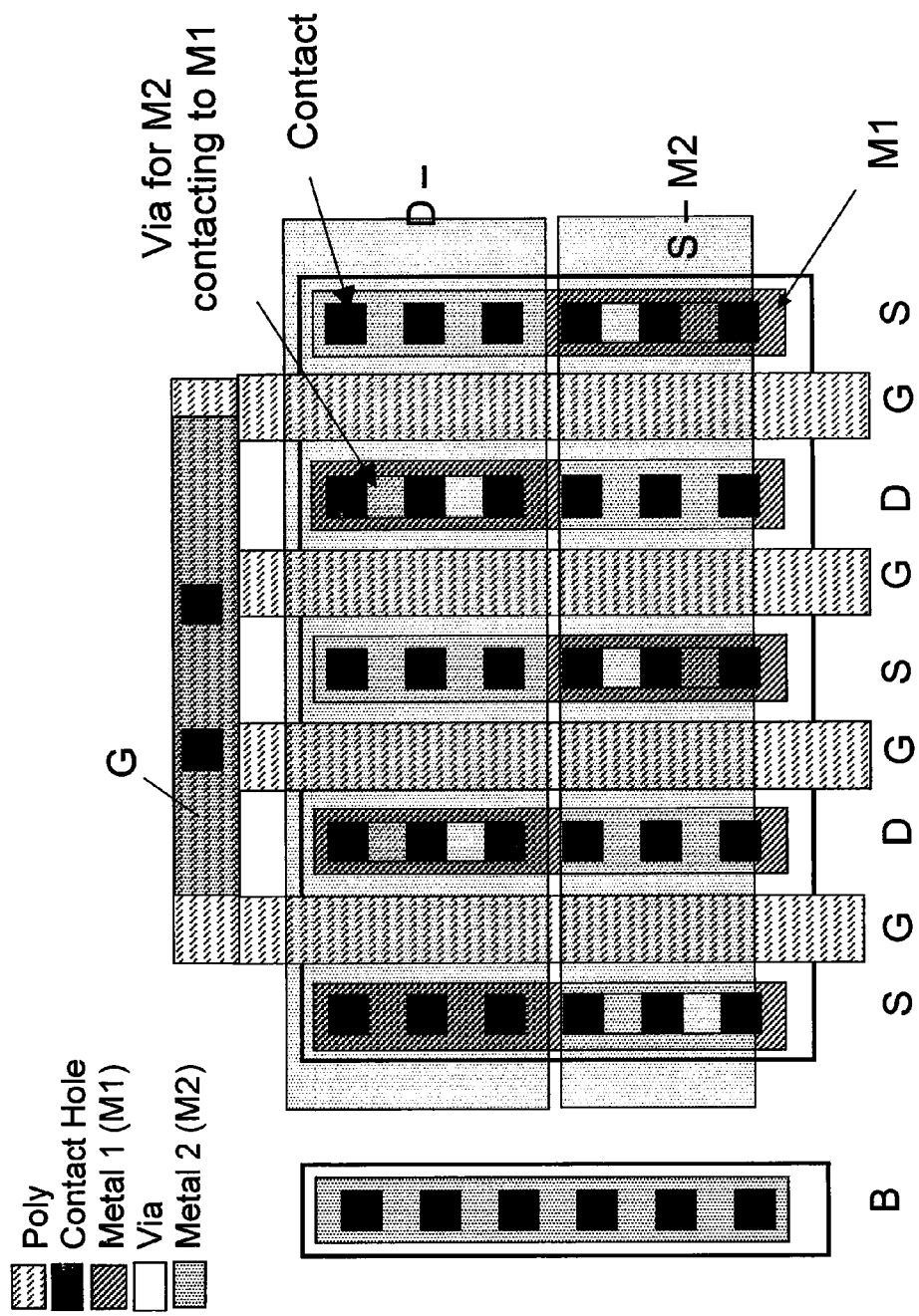
FIGS. 1A to 1B are top views of lateral MOSFET device configured with stripe cells and square cells respectively for increasing the channel width per unit area as that implemented in conventional devices.
Figure 1B:
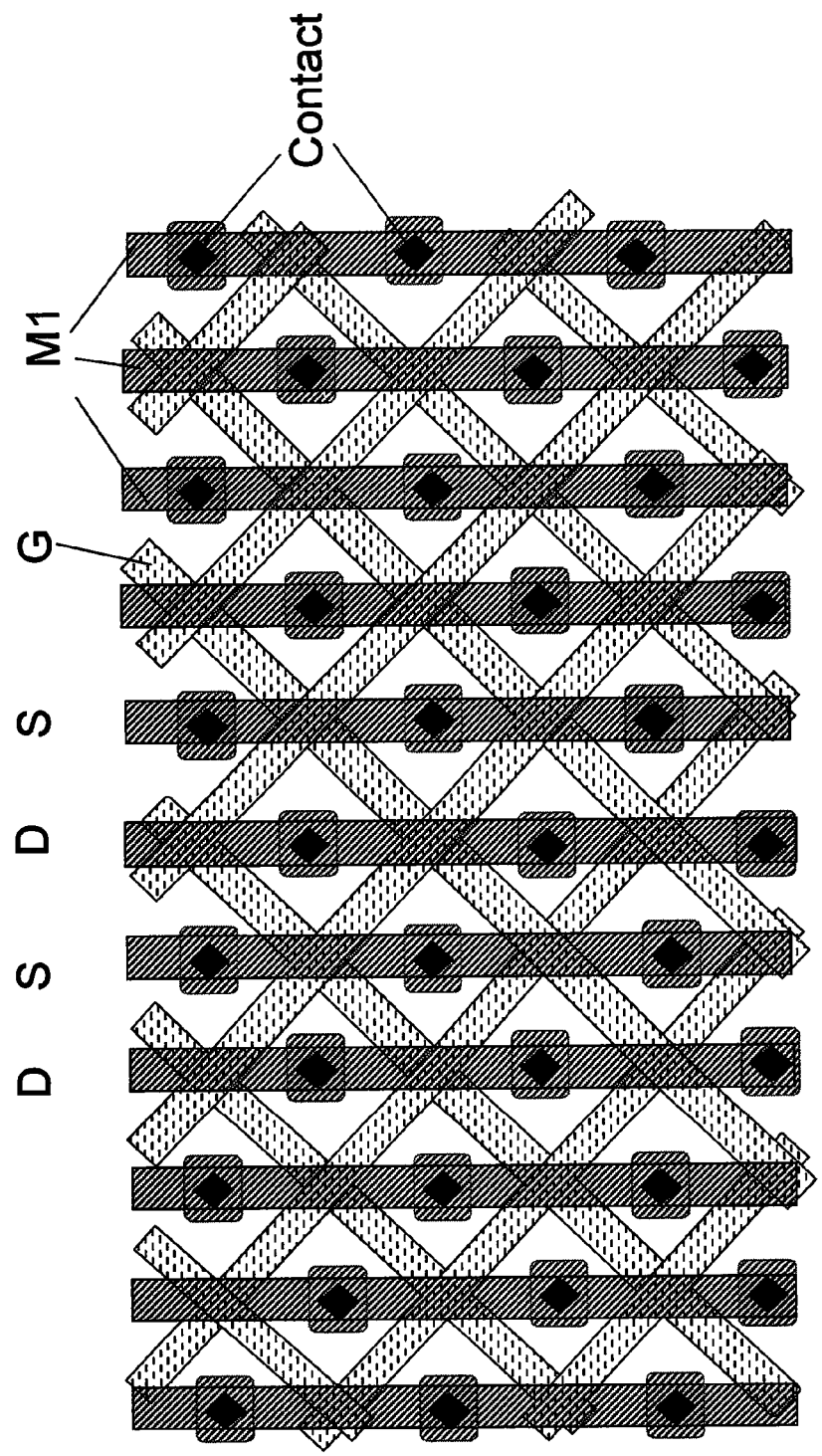
Figure 2A:
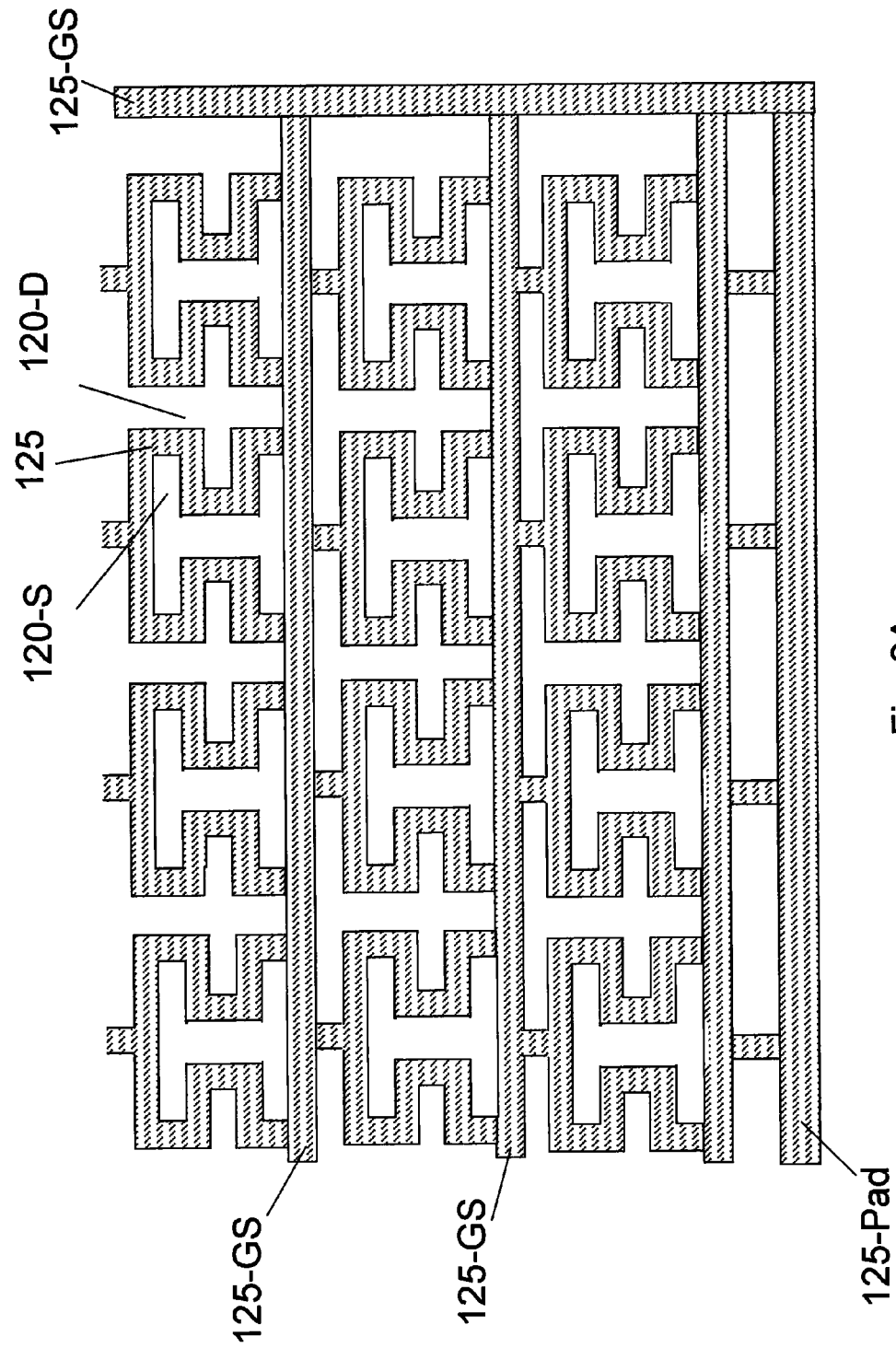
FIGS. 2A to 2E are a serial of top views of a MOSFET cell array for showing the novel layout of this invention wherein the polysilicon gates are configured with wave-shaped patterns and metal layers for contacting to the drain, the source and the gate are formed.

Referring to FIGS. 2A to 2E for a serial of top views for showing the polysilicon layout in FIG. 2A and the processes in forming contacts and the source, drain and gate metal layers for providing electrical contacts for the lateral semiconductor power device of this invention. FIG. 2F is a side cross sectional view of the lateral semiconductor power transistor cell across line A-A' in FIG. 2A. As shown in FIGS. 2F and 2A, the lateral semiconductor power device 100 is supported on a semiconductor substrate 105 formed with an epitaxial layer 110 with a P-well 115 formed in the epitaxial layer 110. Alternatively, the P-well 115 may be formed directly on top of substrate 105 without epitaxial layer 110. The semiconductor power transistor cell further includes a source region 120-S and a drain region 120-D with a polysilicon gate 125 disposed on top of a gate oxide layer 130 for controlling a channel between the source and the drain regions. The semiconductor power transistor cell is covered by an insulation layer 135 opened with contact openings 140-S and 140-D filled with source and drain contact metal 150-S and 150-D. A salicided layer 142 extends the contact to the source and drain regions away from the contact opens to reduce the source/drain silicon resistance. The semiconductor power transistor cell further includes a second metal layer 160 on top of metal 150-S and 150-D separated by an insulation layer 152. The second metal layer 160 further consists of a 160-S portion serving as a source pad and a 160-D portion (not shown) serving as a drain pad. Source pad 160-S is connected to source metal 150-S through inter-metal connection via 155-S. Drain pad 160-D is connected to drain metal 155-D through inter-metal connection via 155-D (not shown).

Figure 2B:
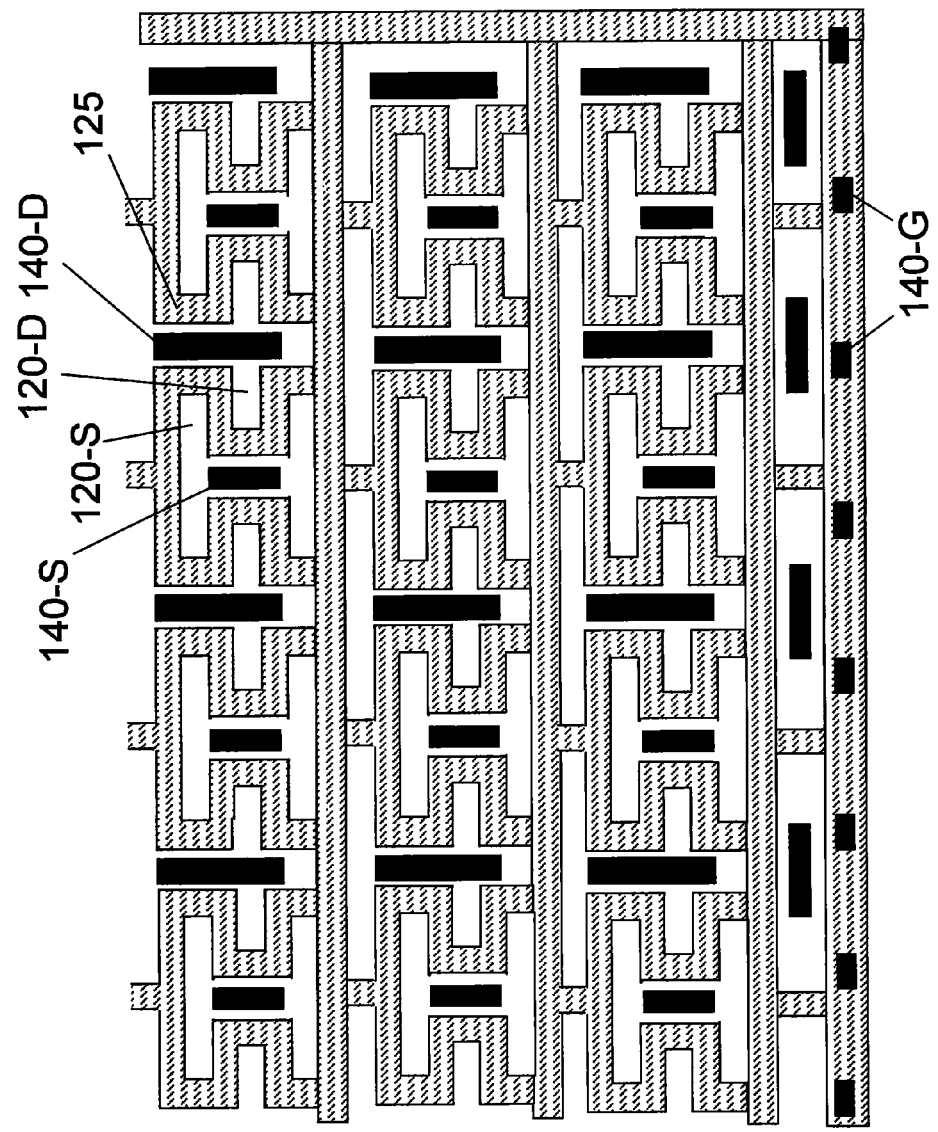
Figure 2C:
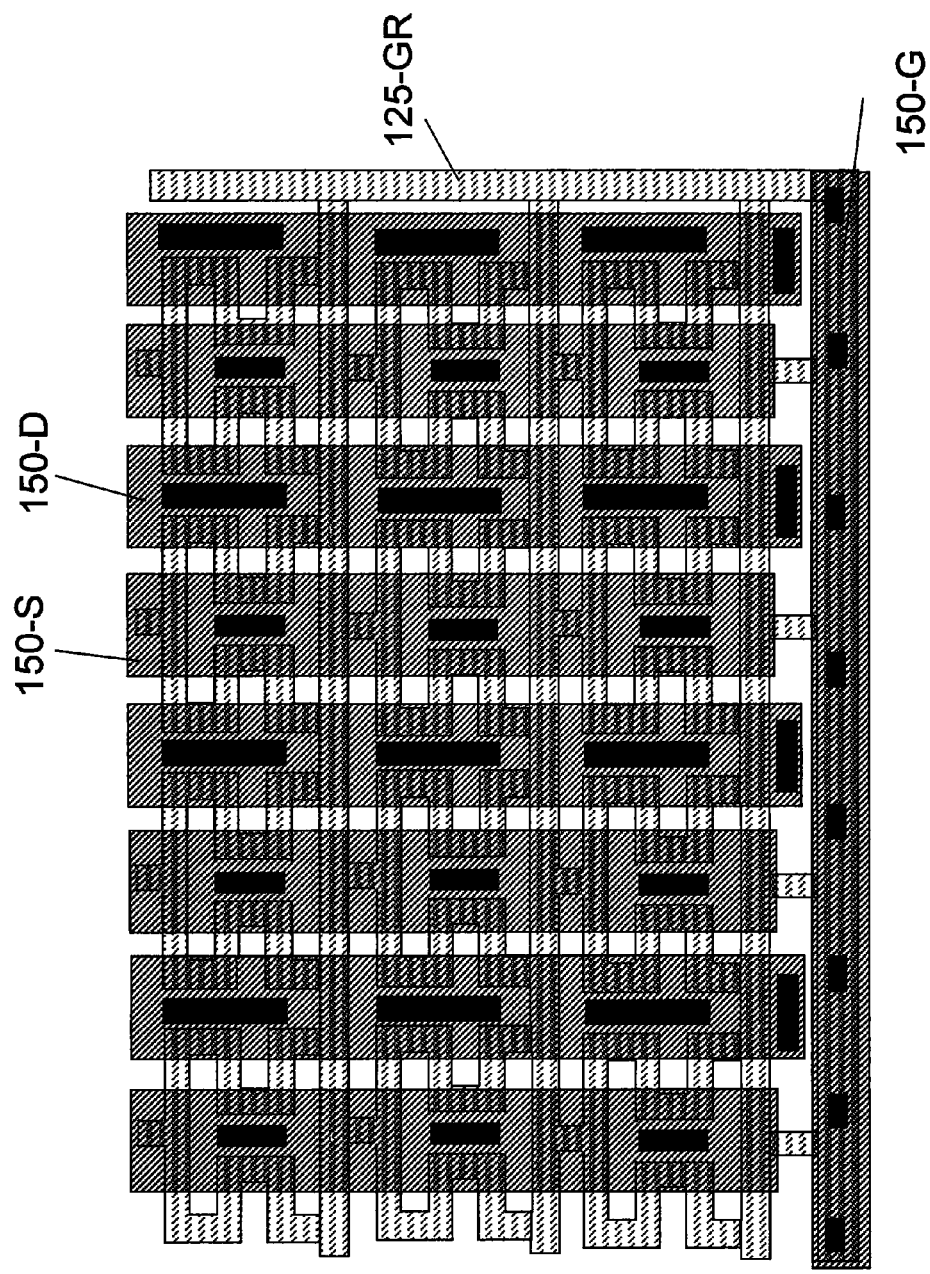
Figure 2D:
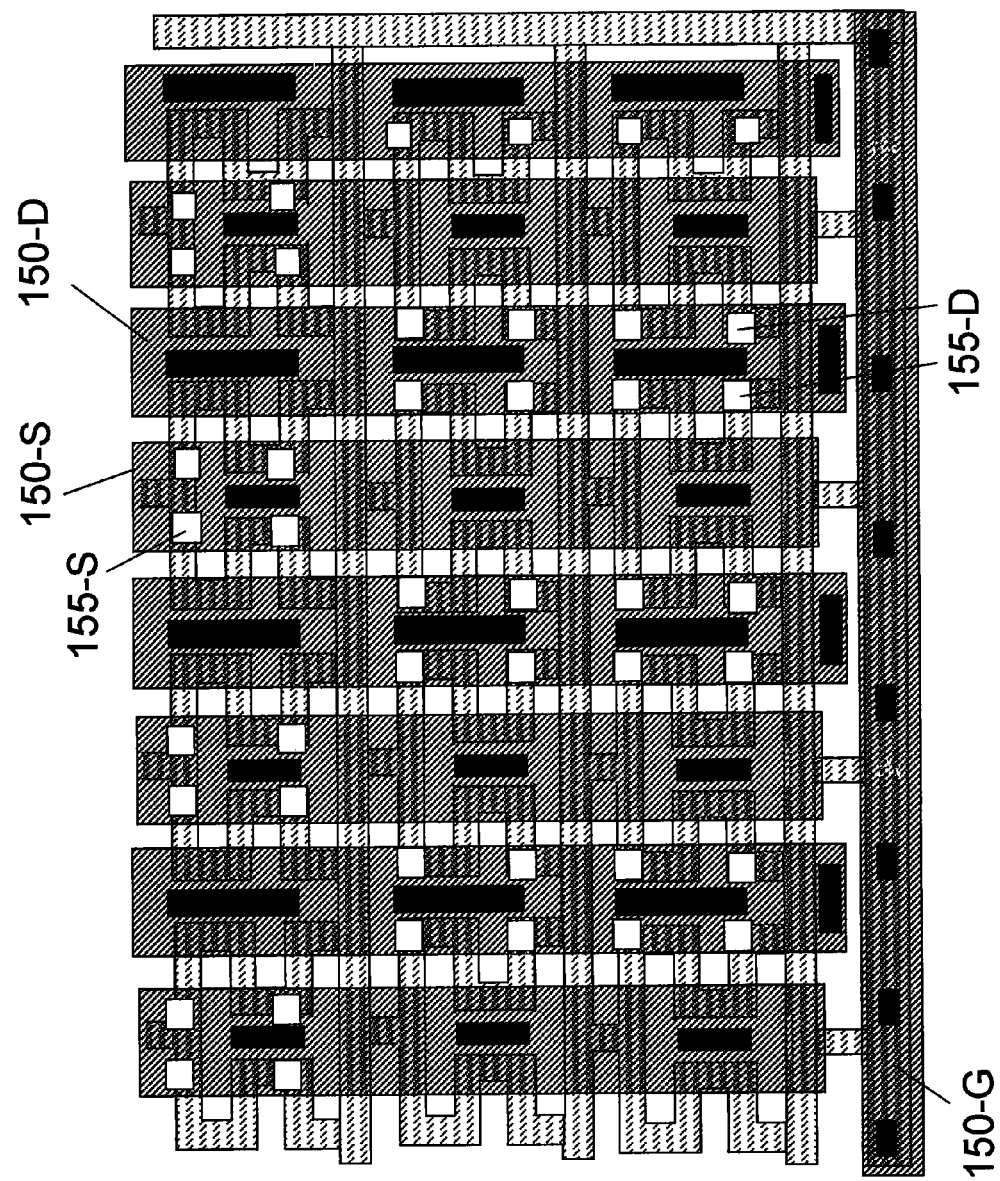
Figure 2E:
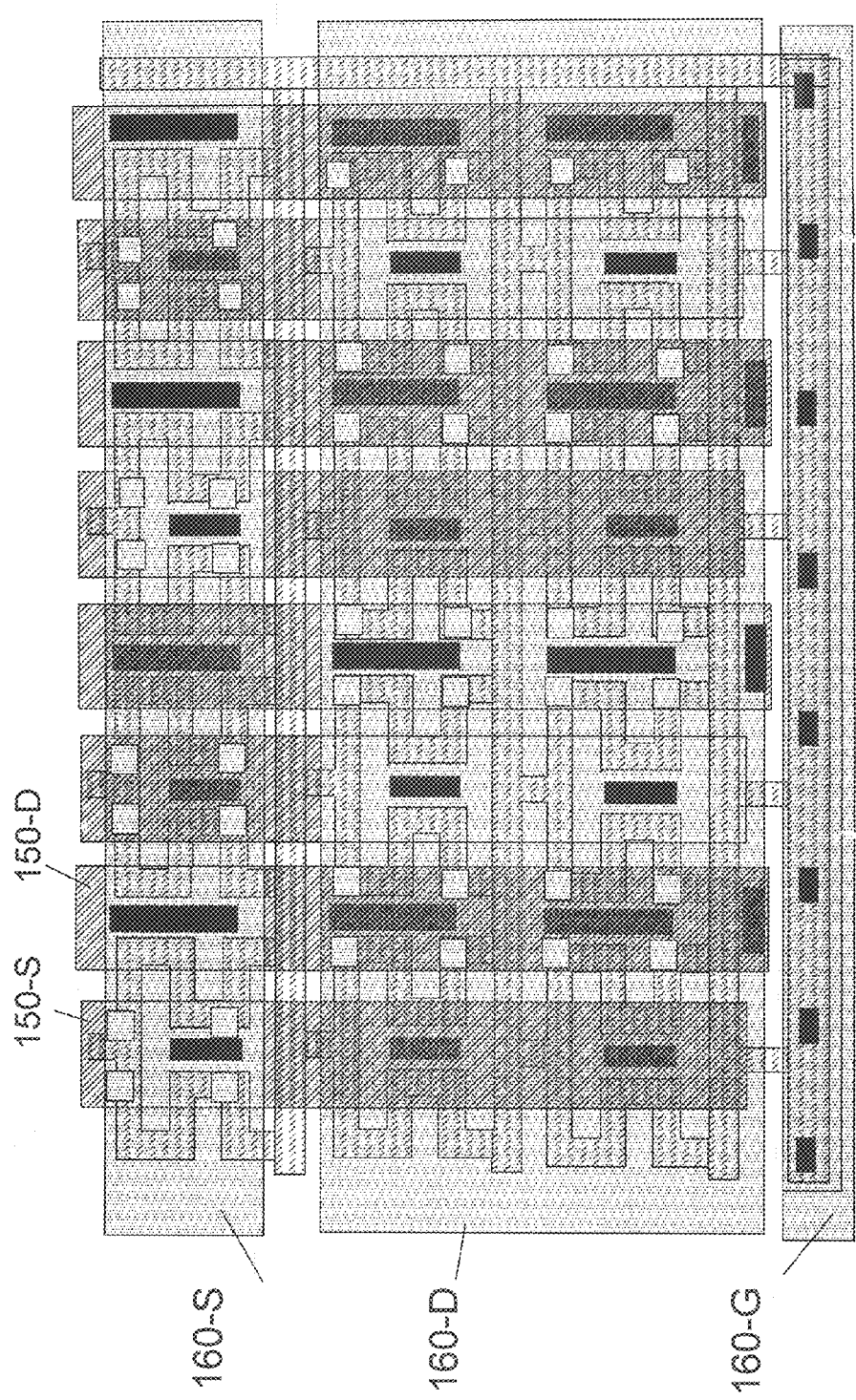
Figure 2F:
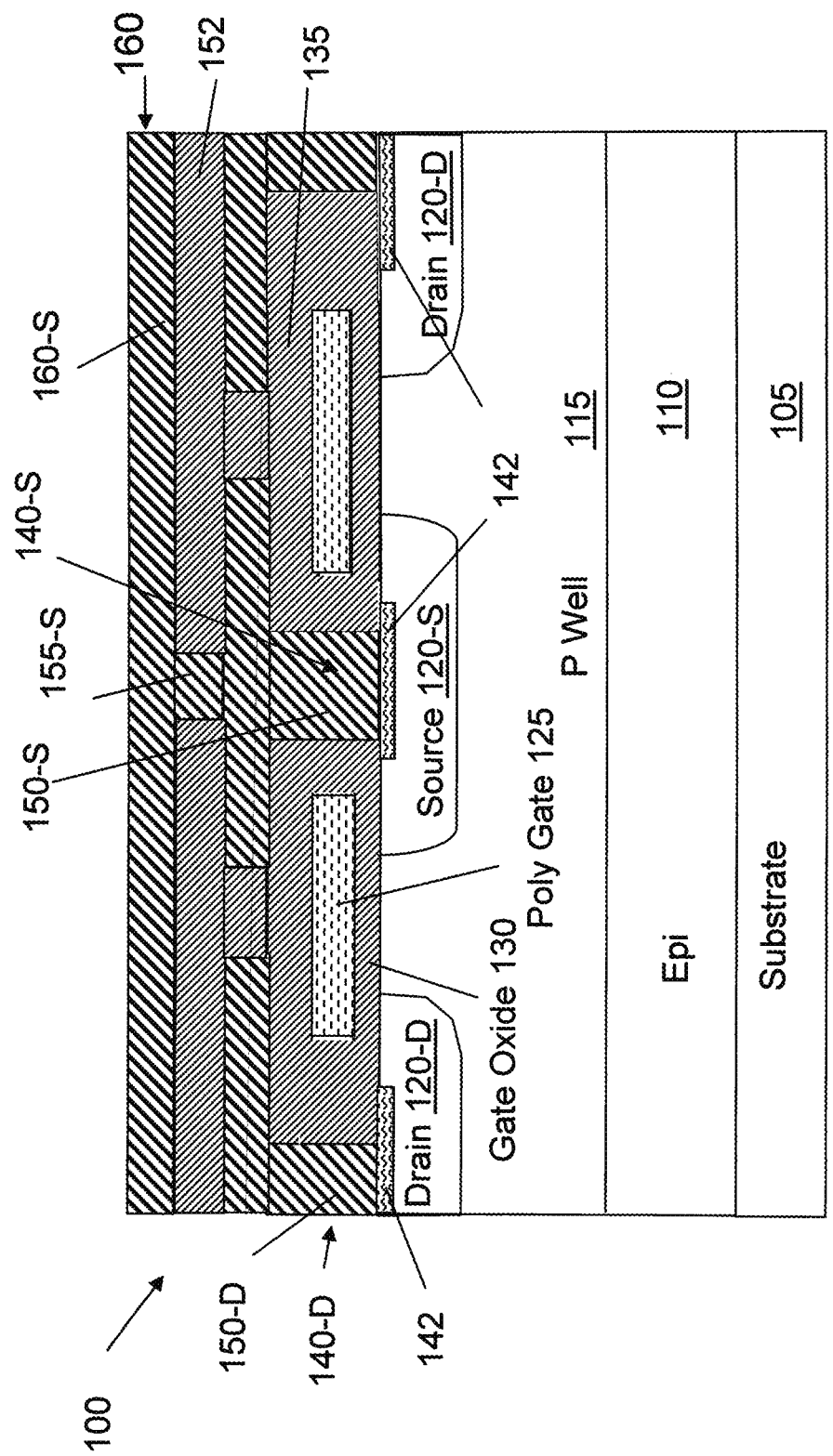
FIG. 2F is a side cross sectional view for showing the cell structure across the A-A' shown in FIG. 2A.

Referring to FIG. 2B, after the device is fabricated with the gate 125 and the source and drain regions 120-S and 120-D respectively in place, then a silicide layer 142 (see FIG. 2F) is formed. The manufacturing processes proceed with the deposition of a passivation layer. Then, Contact openings are etched. A plurality of source and drain contact openings 140-S and 140-D are formed for contacting the source regions 120-S and the drain regions 120-D. Also, gate contact openings 140-G are formed on top of the gate pad 125-pad for contacting the gate pad 125-pad. Referring to FIG. 2C, a first metal layer is deposited and filled in the source contact openings 140-S, the drain contact openings 140-D and the gate contact openings 140-G. The first metal layer is further patterned into a plurality of source metal 110-S, drain metal 150-D and gate metal 150-G to separate each electrode from the other. Referring to FIG. 2D, a second insulation layer is formed to cover the first patterned metal layer 150-S and 150-D. Then a plurality of inter-metal connection via 155-S and 155-D are opened through the insulation layer for connecting to the underlying metal stripes 150-S and 150-D. In the embodiment shown in FIG. 2D, the inter-metal connection via 155-S over each source metal strip 150-S is on the upper portion of the device while the inter-metal connection via 155-D over each drain metal strip 150-D is on the lower portion of the device. In another embodiment (not shown) the inter-metal connection via 155-S over each source metal strip 150-S is on the lower portion of the device while the inter-metal connection via 155-D over each drain metal strip 150-D is on the upper portion of the device. In FIG. 2E, a second metal layer is deposited to fill inter-metal connection via 155-S and 155-D. The second metal layer is further patterned into a second source metal 160-S, a second drain metal 160-D and a second gate metal 160-G. All the metal stripes 150-S connect to source metal 160-S through a plurality of inter-metal connection via 155-S and all the metal stripes 150-D connect to drain metal 160-D through a plurality of inter-metal connection via 155-D. The source metal 160-S and drain metal 160-D therefore provide source pad and drain pad for wire bonding or other connection means.

In the embodiment as shown in FIG. 2D and FIG. 2E, the source regions in the lower portion of the device is connected to the lower portion of metal strip 150-S through metal stripe 150-S to reach the inter-metal connection via 155-S. Compare to the source regions in the upper portion of device where the connection to the inter-metal connection via 155-S is directly through the upper portion of metal stripe 150-S, the source region in the lower portion of device will bear a higher resistance. The same is true for the drain region in the upper portion of the device. This increases the overall resistance.

Figure 3:
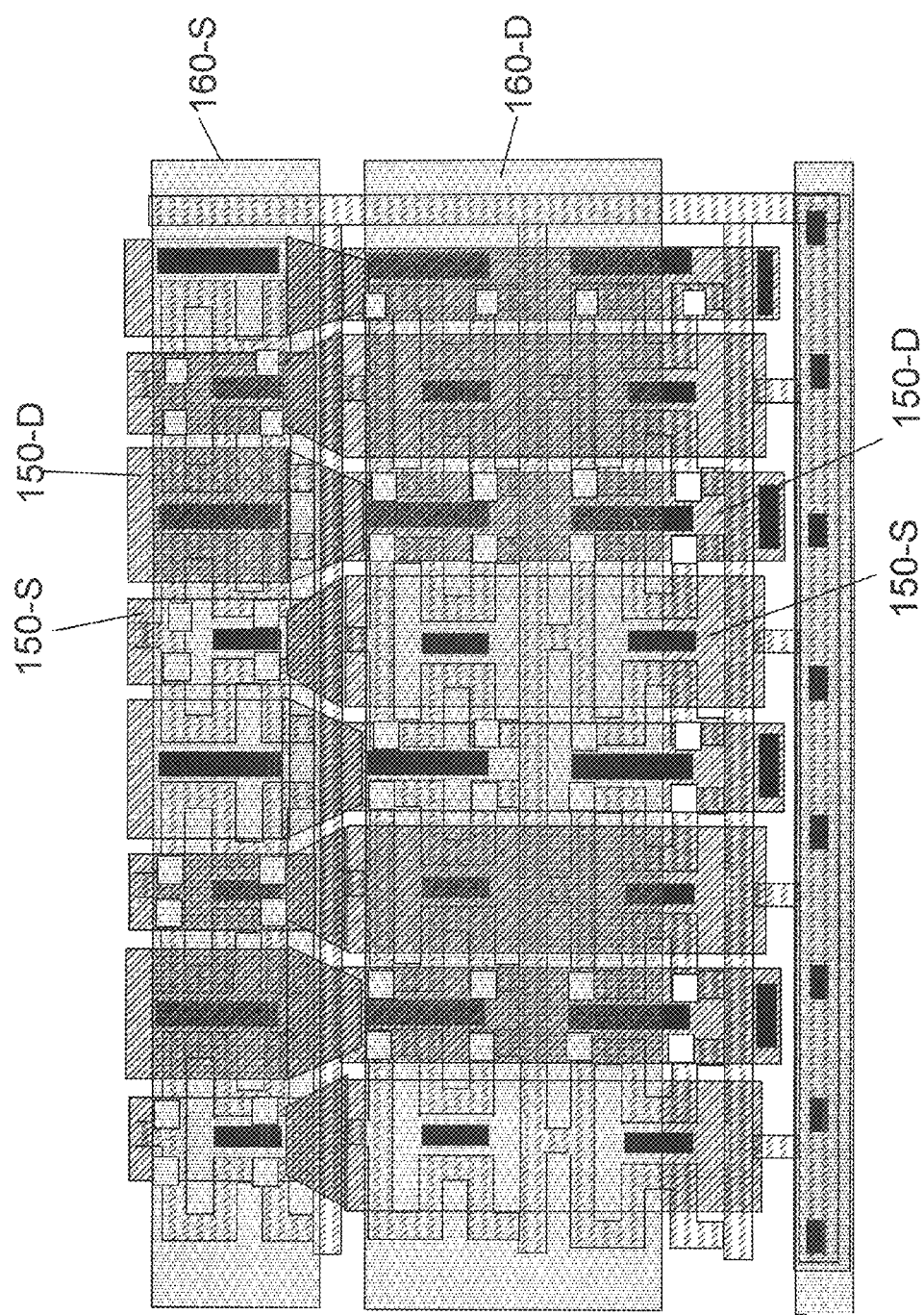
FIG. 3 is another top view for showing a different embodiment of this invention.

Referring to FIG. 3 for an alternate embodiment of this invention where the first metal layer is patterned into a plurality of M1 strip with different width for connecting to source or drain contacts. The lower portion of metal strip 150-S is wider then the upper portion to reduce lower portion source resistance. The upper portion of metal strip 150-S is narrower to make room for extending the width of metal strip 150-D in the upper portion therefore reduce the drain resistance in the upper portion. The embodiment as shown in FIG. 3 therefore reduces the overall device resistance.

According to FIGS. 2A to 2E and FIG. 3 the poly-silicon gate region of the lateral MOSFET cells separates the source and the drain region and the polysilicon gates are configured with a wave pattern. The wave pattern of the polysilicon gates is configured to comply with a minimum poly spacing rule as that allowed by current processing technology. Since the polysilicon stripe is drawn to minimum spacing without the source and drain contacts between the polysilicon wave pattern a higher channel density is obtained which translates to higher W/unit area where W stands for a sum of total channel widths.

Now the channel current between the source and drain regions are collected by the silicon source and drain regions between the polysilicon gate region before flowing into the contacts placed at the end of the wave pattern. This would mean a higher resistance for the device due to additional source/drain silicon resistance. However, in advanced submicron technologies the drain/source silicon resistance is reduced due to silicide formation to about a tenth of the resistance when compared with non-silicided process. Consequently the source/drain resistance does not impact the resistance of the switch.

Furthermore, the polysilicon wave pattern gates are intermittently connected to form a grid in order to reduce poly gate resistance. In addition, this new layout structure has the advantage of increasing channel density without compromising metal 1 resistance. This is beneficial for both single metal process where wide M1 can be used to reduce metal resistance and double metal process where wider M2 bus can be drawn due to lower M1 resistance. As shown in FIG. 2A, the layout feature of the polysilicon wave pattern gates are connected to form a grid in order to reduce polysilicon gate resistance.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used. The technique can apply to both N/P type MOSFETs and LDD MOSFETs. Accordingly, it is intended that the appended claims be interpreted as covering all alterations and modifications as fall within the true spirit and scope of the invention.

We claim:

1. A semiconductor power device supported on a semiconductor substrate comprising:
    a plurality of transistor cells each having a source and a drain region disposed on opposite sides of a gate electrode for controlling an electric current transmitted between the source and the drain regions;
    a first insulation layer covering the semiconductor device having a plurality of contact openings opened through the first insulation layer and said contact openings are filled with source metal contacts and drain metal contacts for contacting the source and drain regions respectively;
    a first metal layer covering over said first insulation layer and patterned into a plurality of source metal stripes contacting said source metal contacts and a plurality of drain metal stripes contacting said drain metal contacts;
    a second insulation layer covering said first set of source and drain metal stripes wherein said second insulation layer having a plurality of source via contacts and drain via contacts penetrate therethrough for contacting said first set of source metal strips and said first set of drain metal strips respectively;
    a second metal layer disposed on top of said second insulation layer and patterned into a source metal and a drain metal for contacting said source via contacts and said drain via contacts respectively through said second insulation layer; and
    wherein each of the source metal stripes having a lower portion wider than an upper portion of the source metal stripes to reduce a lower portion source resistance.

2. The semiconductor power device of claim 1 wherein:
the gate electrode is patterned into a plurality of wave-like shaped gate stripes and extending across a substantial length over said semiconductor device for substantially increasing an electric current conduction area between the source and drain regions across the gate.

3. The semiconductor power device of claim 2 wherein:
said plurality of wave-like shaped gate stripes further are further configured as an interconnected gate electrode grid for reducing gate resistance.

4. The semiconductor power device of claim 2 wherein:
the plurality of wave-like shaped gate stripes extended across the substantial length over the semiconductor device to connect to a gate pad disposed on a peripheral portion of said semiconductor substrate.

5. The semiconductor power device of claim 2 wherein:
the plurality of wave-like shaped gate stripes are patterned to have a minimum distance between adjacent wave-like shaped stripes according to a manufacturing and minimum spacing design rule.

6. The semiconductor power device of claim 1 wherein:
the gate electrode further comprising a polysilicon layer and padded by a gate insulation layer on top of said semiconductor substrate and patterned into a plurality of wave-like shaped polysilicon stripes extended across the semiconductor device.

7. The semiconductor power device of claim 1 further comprising:
a salicide layer disposed in an upper portion of said source region and said drain region immediately below a top surface of the semiconductor substrate for expanding an area of a source metal contact and a drain metal contact for reducing a drain to source resistance wherein the source metal contacts and drain metal contacts directly contacting said salicide layer in said source and drain regions respectively.

8. The semiconductor power device of claim 1 wherein:
said source metal and said drain metal are patterned and disposed over said second insulation layer on two opposite sides of said semiconductor power device.

9. The semiconductor power device of claim 1:
the second metal layer disposed on top of the second insulation layer is further patterned into a gate metal for contacting a gate pad electrically connected to the gate electrode.

10. The semiconductor power device of claim 1 wherein:
the upper portion of the source metal stripes having a narrower width to allow for greater width for an upper portion of the drain metal stripes to reduce a drain resistance in an upper portion of the power device.

\* \* \* \* \*